United States Patent
Langer et al.

(10) Patent No.: US 9,252,820 B2
(45) Date of Patent: Feb. 2, 2016

(54) CIRCUIT AND MOBILE COMMUNICATION DEVICE

(71) Applicant: Intel Mobile Communications GmbH, Neubiberg (DE)

(72) Inventors: Andreas Langer, Lohhof (DE); Harald Pretl, Schwertberg (AT)

(73) Assignee: Intel Mobile Communications GmbH, Santa Clara, CA (US)

( * ) Notice: Subject to any disclaimer, the term of this patent is extended or adjusted under 35 U.S.C. 154(b) by 50 days.

(21) Appl. No.: 14/163,219

(22) Filed: Jan. 24, 2014

(65) Prior Publication Data

US 2014/0213203 A1    Jul. 31, 2014

(30) Foreign Application Priority Data

Jan. 31, 2013  (DE) .......................... 10 2013 201 653

(51) Int. Cl.
*H04B 1/04*  (2006.01)
*H01Q 11/12*  (2006.01)

(52) U.S. Cl.
CPC ........ *H04B 1/0458* (2013.01); *H03F 2200/111* (2013.01); *H03F 2200/432* (2013.01); *H04B 2001/0408* (2013.01)

(58) Field of Classification Search
CPC .................. H03F 2200/429; H03F 2200/432; H03F 2200/111; H04B 1/406
USPC ........... 455/127.1, 127.2, 127.3, 127.4, 552.1
See application file for complete search history.

(56) References Cited

U.S. PATENT DOCUMENTS

| | | | |
|---|---|---|---|
| 5,509,643 A * | 4/1996 | Carstens et al. | 267/140.12 |
| 5,909,643 A | 6/1999 | Aihara | |
| 7,643,463 B1 * | 1/2010 | Linsky et al. | 370/344 |
| 2002/0145469 A1 * | 10/2002 | Charley et al. | 330/51 |
| 2006/0055445 A1 * | 3/2006 | Khajehpour | H03F 1/3211 327/359 |
| 2006/0098617 A1 * | 5/2006 | Vayrynen et al. | 370/347 |
| 2007/0281652 A1 * | 12/2007 | Tanaka et al. | 455/260 |
| 2008/0080549 A1 * | 4/2008 | Rofougaran | H03F 1/0222 370/458 |
| 2008/0137566 A1 * | 6/2008 | Marholev | H04B 1/406 370/310 |
| 2009/0201084 A1 * | 8/2009 | See et al. | 330/51 |
| 2013/0116005 A1 * | 5/2013 | Ganti et al. | 455/552.1 |

FOREIGN PATENT DOCUMENTS

| | | |
|---|---|---|
| DE | 10200048 A1 | 7/2003 |
| DE | 102007028066 B3 | 2/2009 |
| EP | 0977354 A1 | 2/2000 |

OTHER PUBLICATIONS

"German Application Serial No. 102013201653.0, Office Action mailed Oct. 4, 2013", w/English translation, 8 pgs.

* cited by examiner

*Primary Examiner* — Duc M Nguyen
(74) *Attorney, Agent, or Firm* — Schwegman Lundberg & Woessner, P.A.

(57) ABSTRACT

A description is given of a circuit having a transmitter having a first transmission stage for generating a first transmission signal according to a first standard and a bias stage for generating a bias signal for a second standard and a second transmission stage for generating a second transmission signal according to the second standard. The second transmission stage is effectively coupled to the bias stage in order to receive the bias signal.

14 Claims, 3 Drawing Sheets

US 9,252,820 B2

CIRCUIT AND MOBILE COMMUNICATION DEVICE

RELATED APPLICATION

This application claims the benefit of priority, under 35 U.S.C. §119 to German Patent Application Serial Number 10 2013 201 653.0, filed on Jan. 31, 2013, which application is incorporated herein by reference in its entirety.

TECHNICAL FIELD

A circuit is described. Such a circuit may be used, for example, in a mobile communication device. A mobile communication device is also described.

TECHNICAL BACKGROUND

Typical wireless communication systems support various standards, for example GSM (GMSK and/or 8 PSK), 3G, CDMA and/or LTE. The importance of GSM is decreasing, but support for this standard is still required, for example on account of backward compatibility or on account of incomplete 3G/LTE coverage in particular areas. Such GSM support partially contradicts the trend on the market for ultra-low-cost implementations. The ultra-low-cost segment is—in addition to the high-end segment which is pursued, for example, in the case of powerful smartphones—a rapidly growing market. Such ultra-low-cost implementations can be used, for example, in data center units in emerging nations or in so-called machine-to-machine communication. For such uses, the total system costs are more important than performance, for example talk time. In other words, consumers are prepared to accept losses in performance as long as the fundamental requirements are met, as predefined by the 3GPP specifications, for example. On account of the fact that 2G support is necessary but is less relevant to standards, for example 3G or LTE, there is a need for low-cost 2G implementations.

SUMMARY OF THE INVENTION

A circuit comprises a transmitter having a first transmission stage for generating a first transmission signal according to a first standard and a bias stage for generating a bias signal for a second standard. The circuit also comprises a second transmission stage for generating a second transmission signal according to the second standard. The second transmission stage is effectively coupled to the bias stage in order to receive the bias signal.

Furthermore, a mobile communication device comprises such a circuit and an antenna connection. An output of the circuit, at which the circuit provides the first transmission signal and the second transmission signal, is coupled to the antenna connection.

DETAILED DESCRIPTION OF THE INVENTION

Figure 1:
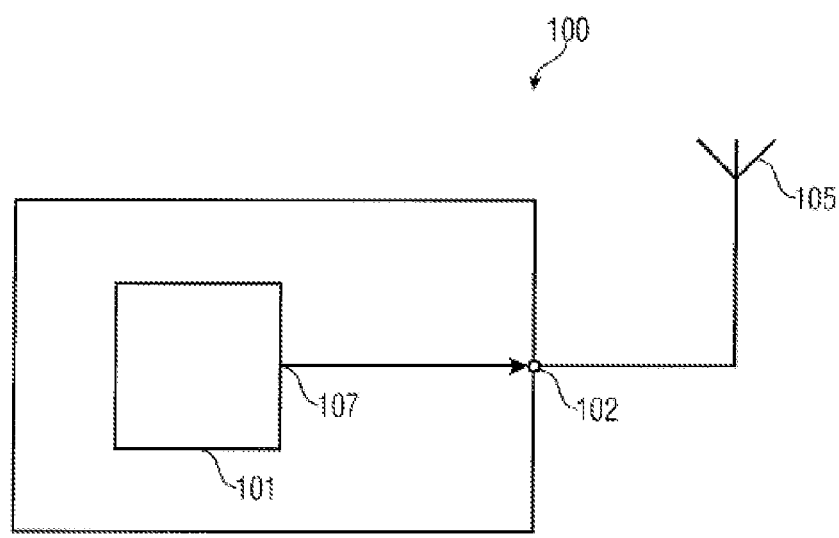
FIG. 1 shows an exemplary mobile communication device.

FIG. 1 shows an exemplary mobile communication device 100. The mobile communication device 100 has a circuit 101 and an antenna connection 102 (for example for connection to an antenna 105). An output 107 of the circuit 101 is coupled to the antenna connection 102. At the output 107, the circuit 101 provides a first transmission signal according to a first (mobile communication) standard and a second transmission signal according to a second (mobile communication) standard.

As also described below using the further figures, the circuit 101 enables an ultra-low-cost implementation for the mobile communication device 100 without dispensing with a relevant standard (for example GSM or 3G/LTE) in the process. Using the circuit 101 in the mobile communication device 100 makes it possible to achieve a mobile communication device 100 which enables extremely cost-effective support for the 2G standard in a multimode system (for example 2G and 3G or 2G and 3G/LTE). Furthermore, the circuit 101 not only reduces the costs of the mobile communication device 100 but also enables increased integration and therefore a reduction in the circuit area required (for example in the form of smaller printed circuit boards).

The mobile communication device 100 may be a portable mobile communication device, for example.

For example, the mobile communication device 100 may be designed to carry out voice communication and/or data communication (according to a mobile communication standard) with another (portable) mobile communication device and/or a mobile communication base station. Such a mobile communication device 100 might be, for example, a portable handheld device, such as a mobile telephone, a so-called smartphone, a tablet PC, a broadband modem, a notebook or a laptop as well as a router or else a PC. Furthermore, such a mobile communication device may also be a mobile communication base station.

Although the circuit 101 is described as part of the mobile communication device 100 in FIG. 1, this circuit 101 can also be used in other circuits or devices. Different exemplary implementations of such a circuit 101 are described below using FIGS. 2 and 3.

Figure 2:
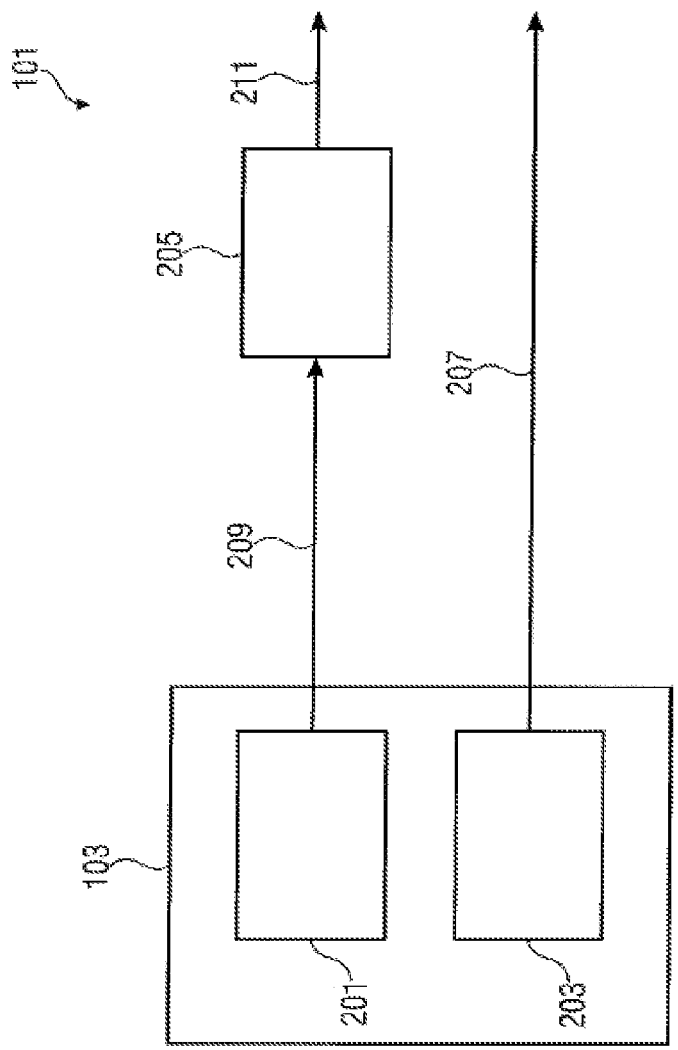
FIG. 2 shows an exemplary circuit.

FIG. 2 shows an exemplary implementation of the circuit 101. The circuit 101 has a transmitter 103. The transmitter 103 has a first transmission stage 203 and a bias stage 201. The circuit 101 also has a second transmission stage 205. The first transmission stage 203 is designed to generate a first transmission signal 207 according to a first standard. The bias stage 201 is designed to generate a bias signal 209 for a second standard. The second transmission stage 205 is designed to generate a second transmission signal 211 according to the second standard. The second transmission stage 205 is effectively coupled to the bias stage 201 in order to receive the bias signal 209.

It becomes clear from FIG. 2 that the bias generation for the second transmission stage 205 (for example for a power amplifier (PA)) is integrated in the transmitter 103. The inventors have learned that the bias stage 201 as well as the rest of the transmitter 103 can both be produced in an integrated form based on a CMOS process. This makes it possible to integrate the bias stage 201 in the transmitter 103, with the result that said stage no longer needs to be designed outside the transmitter 103. In other words, the transmitter 103, which may typically be based on a CMOS process anyway, undertakes the functions of a bias controller for the second transmission stage 205 for the second standard, which controller is normally externally provided. It is therefore clear from FIG. 2 that the bias signal 209 for the second transmission stage 205 is generated in the transmitter 103 (by means of the bias stage 201) and is passed to the (external) second transmission stage 205, for example by means of a special analog control interface.

The transmitter 103 (or the bias stage 201 of the transmitter 103) can provide the bias signal 209 on the basis of a transmission mode (for example GMSK or 8 PSK), a desired output power, a desired output frequency and/or an ambient temperature. This means that an external CMOS controller which is still provided in conventional systems is no longer needed to provide the bias signal for the second transmission stage 205 and can therefore be omitted, which results in lower costs and a smaller size of the circuit 101. In another exemplary implementation, it is also possible for an output power of the second transmission signal 211 (for example in a GMSK mode or an 8 PSK mode) to be set by changing an input power of an input signal of the second transmission stage 205. This simplifies the generation of the bias signal 209 since in this case the bias signal 209 can be generated in the same manner both for 8 PSK and for GMSK.

On account of the fact that the bias stage 201 is integrated in the transmitter 103, it is possible for the second transmission stage 205 to be implemented completely without such a bias stage (based on CMOS technology). The second transmission stage 205 can therefore be completely based, for example, on so-called gallium arsenide (GaAs) technology which provides a significant advantage over CMOS-based power amplifiers with regard to performance. In the case of the circuit 101, the bias signal 209 for the second transmission stage 205 (for example for a 2G power amplifier of the second transmission stage 205) is therefore generated in the transmitter 103 and a CMOS-less power amplifier design (for the second transmission stage 205) is therefore enabled.

Figure 3:
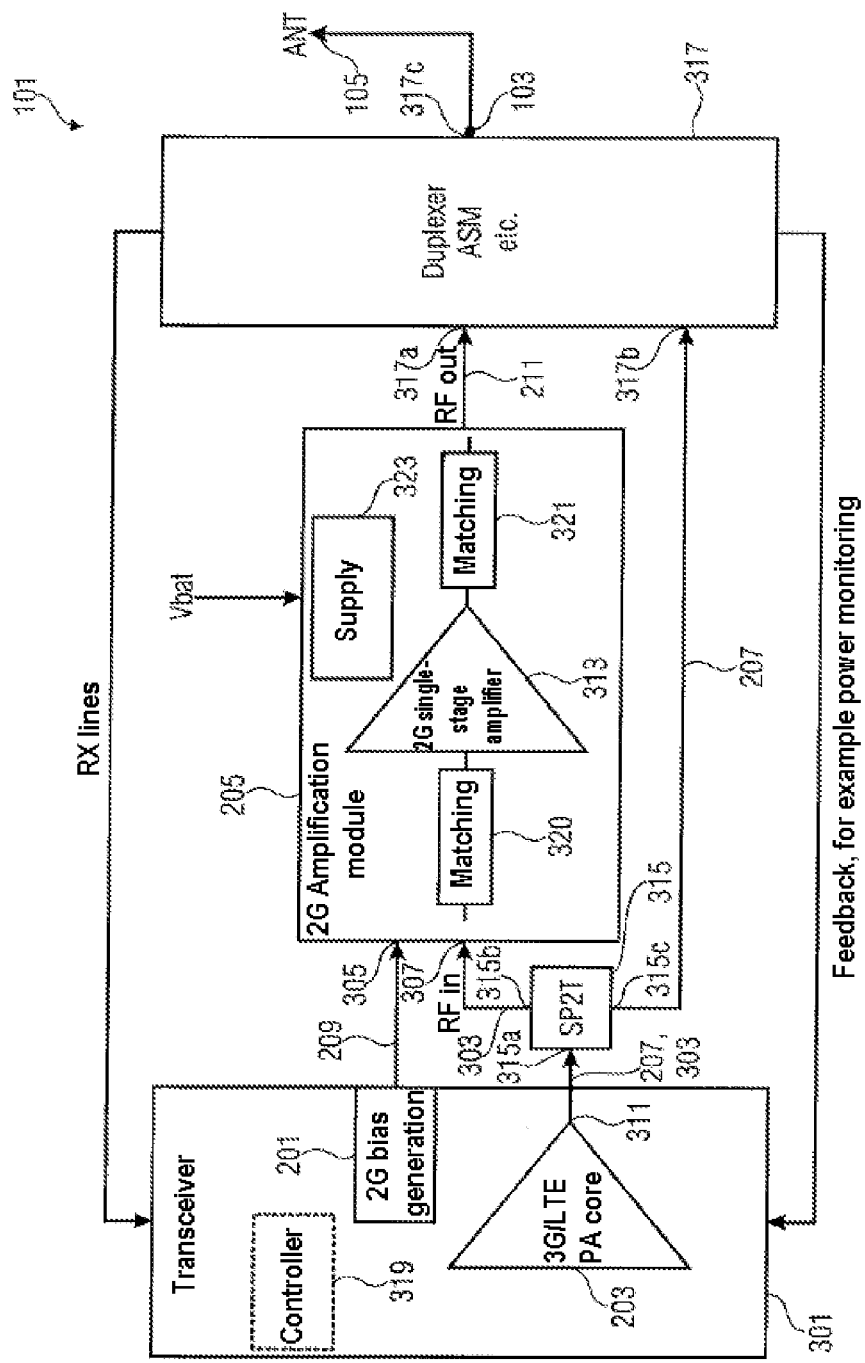
FIG. 3 shows an exemplary implementation of the circuit shown in FIG. 2.

FIG. 3 shows an exemplary implementation of the circuit 101 from FIG. 2. In the implementation in FIG. 3, the transmitter 103 is part of a transceiver 301 which comprises the transmitter 103 and therefore also the bias stage 201 and the first transmission stage 203. However, in further exemplary implementations of the circuit 101, it is also possible for the circuit 101 to not have a receiving function, with the result that, instead of the transceiver 301, only a transmitter 103 is provided in the circuit 101 and comprises the bias stage 201 and the first transmission stage 203.

The transceiver 301 may have an integrated circuit which comprises both the first transmission stage 203 and the bias stage 201. In other words, the bias stage 201 which generates the bias signal 209 for the (external) second transmission stage 205 can be arranged in an integrated manner together with the first transmission stage 203 (and remaining components of the transceiver 301) on the same chip. Arranging the bias stage 201 in the transceiver 301 (as part of the latter) enables both a more cost-effective and more space-saving implementation of the circuit 101 in comparison with systems in which the bias stage 201 is an external component.

Therefore, the circuit 101 has a first integrated circuit which comprises the transceiver 301 and therefore the bias stage 201 and the first transmission stage 203. The circuit 101 may also have a further integrated circuit which comprises the second transmission stage 205. In this case, the further integrated circuit is outside the integrated circuit of the transceiver 301. Using the two integrated circuits also makes it possible for the integrated circuit of the transceiver 301 to be based on a first process (for example CMOS process) and for the integrated circuit of the second transmission stage 205 to be based on a second process (for example a gallium arsenide process). In the case of the circuit 101 shown in FIG. 3, the components which can be produced using the same process are therefore respectively combined in a common integrated circuit in order to save both costs and space.

FIG. 3 also shows that the second transmission stage 205 is effectively coupled to the first transmission stage 203 in order to receive a further signal 303 generated by the first transmission stage 203 and to generate the second transmission signal 211 on the basis of the received further signal 303 and the received bias signal 209. In other words, the second transmission stage 205 is designed to receive the bias signal 209 at a bias input 305 and to receive the further signal 303 provided by the first transmission stage 203 at a data signal input 307. The second transmission stage 205 is also designed to provide the second transmission signal 211 according to the second standard at a data signal output 309. The data signal input 307 of the second transmission stage 205 is coupled to an output 311 of the first transmission stage 203, at which the first transmission stage provides both the first transmission signal 207 according to the first standard and the further signal 303.

In comparison with known systems, this implementation of the circuit 101, in which the second transmission stage 205 receives an output signal from the first transmission stage 203 in order to provide the second transmission signal 211 according to the second standard on the basis of said output signal, makes it possible to further reduce costs and the required size since the first transmission stage 203 can be used both to amplify the first transmission signal 207 according to the first standard and for basic amplification of the second transmission signal 211 according to the second standard.

The inventors have learned that the integrated CMOS amplifier (the first transmission stage 203 for the first standard) can be used to simplify the design of the second transmission stage 205 (the power amplifier for the second transmission signal 211 according to the second standard), which results in a smaller area and lower costs of the entire circuit 101.

For example, a 2G amplifier is typically implemented using three amplification stages. In this case, the first two amplification stages act as driver stages and provide the input power for the third stage which provides the highly saturated output power needed in the 2G mode (for example around 35 dBm).

In the exemplary implementation of the circuit 101, as shown in FIG. 3, the amplifier core which is present anyway in the first transmission stage 203 is not only used to amplify the first transmission signal 207 according to the first standard but also as a driver stage for the external 2G amplifier (for the second transmission stage 205). This makes it possible for the second transmission stage 205 to have, as an amplification element, only a 2G single-stage amplifier 313 which provides the highly saturated output power for the 2G function according to the second standard. In other words, the first transmission stage 203 can be configured in such a manner that, when providing the further signal 303, a functionality of the first transmission stage 203 corresponds to the functionality of two amplification stages according to the second standard which are connected in series. The second transmission stage 205 comprises the 2G single-stage amplifier 313 which comprises a third amplification stage according to the second standard. The 2G single-stage amplifier 313 is designed to receive the further signal 303 and to amplify it using the third amplification stage in order to obtain the second transmission signal 211 according to the second standard (for example a 2G standard).

For example, the 2G single-stage amplifier 313 may have a single-stage transistor network having a first transistor for amplifying a first component and a second transistor for amplifying a second component of the further signal 303 if the further signal is a differential signal. In the case of a single-ended signal 303, the 2G single-stage amplifier 313 may have a single transistor for amplifying the further signal 303.

In order to adapt the functionality of the first transmission stage 203 for the second transmission signal 211 according to the second standard, the first transmission stage 203 (for example in the form of a 3G/LTE amplifier if the first standard is a 3G/LTE standard) can be reconfigured, for example using different bias points, in order to be able to generate the required input power for the 2G single-stage amplifier 313.

Furthermore, the circuit 101 shown in FIG. 3 has a changeover switch 315. The changeover switch can also be referred to as a so-called SP2T changeover switch (SP2T—single pole dual throw). The changeover switch 315 has an input 315a, a first output 315b and a second output 315c. The input 315a of the changeover switch 315 is coupled to the output 311 of the first transmission stage 203, at which the first transmission stage 203 (selectively) provides both the first transmission signal 207 and the further signal 303.

The first output 315b of the changeover switch 315 is connected to the data signal input 307 of the second transmission stage 205, at which the second transmission stage 205 receives the further signal 303. The second output 315c may be connected to an RF front-end 317 of the circuit 101, for example. The changeover switch 315 is designed to connect its input 315a to its first output 315b in a first (2G) mode (of the circuit 101) in which the first transmission stage 203 provides the further signal 303 and to connect its input 315a to its second output 315c in a second (3G/LTE) mode in which the first transmission stage 203 provides the first transmission signal 207 according to the first standard. In the first mode of the circuit 101, the latter can transmit the second transmission signal 211 according to the second standard and, in the second mode, the circuit 101 can transmit the first transmission signal 207 according to the first standard, for example.

The changeover switch 315 is therefore used to change over between the two transmission modes of the circuit 101 (for example 2G mode or 3G/LTE mode). In the first mode of the circuit 101, the first transmission stage 203 and the second transmission stage 205 are connected in series in this case in order to provide the second transmission signal 211 according to the second standard and, in the second mode of the circuit 101, the second transmission stage 205 is circumvented, with the result that the first transmission stage 203 directly provides the first transmission signal 207 according to the first standard (for example at the RF front-end 317 of the circuit 101).

The additional changeover switch 315 is therefore used to connect the output 311 of the integrated power amplifier 203 either to the RF front-end 317 (if the circuit 101 operates in a 3G/LTE mode) or to the 2G single-stage amplifier 313 (if the circuit 101 operates in the 2G mode). The additional changeover switch 315 can either be implemented as a separate switch or can also be integrated in the transceiver 301. In this case, the transceiver 301 would have two RF outputs, one output for connection to the second transmission stage 205 (with the 2G single-stage amplifier 313) and one output for connection to the RF front-end 317.

Furthermore, the circuit 101 shown in FIG. 3 may have a controller 319. The controller 319 may be part of the transceiver 301, in particular. The controller 319 may also be part of an integrated circuit of the bias stage 201 and of the first transmission stage 203. In other words, both the controller 319 and the bias stage 201 and the first transmission stage 203 may be part of the same integrated circuit of a transmitter of the transceiver 301.

The controller 319 is designed to set an output power of the second transmission signal 211 at the second transmission stage 205 by changing a bias for the first transmission stage 203. In other words, the output power of the second transmission signal 211 can be achieved both for a GMSK mode and an 8 PSK mode by setting the input power of the further signal 303 by varying a bias of the first transmission stage 203 using the controller 319. This simplifies the generation of the bias for the bias signal 209 for the second transmission stage 205 since in this case the 8 PSK mode and the GMSK mode can be handled in a similar manner. The second transmission stage 205 sets a quiescent current and therefore a gain of the single-stage amplifier 313 on the basis of the bias signal 209.

The controller 319 may be designed, for example, to also set the bias signal 209 on the basis of a power of the provided second transmission signal 211 according to the second standard. In this case, the power of the second transmission signal 211 can be measured in the RF front-end 317, for example, and the bias signal 209 can be adapted on the basis of the measured power in the transceiver 301. Furthermore, a power of the first transmission signal 207 can also be measured in the RF front-end 317 and a bias for the first transmission stage 203 can be set on the basis of the measured power of the first transmission signal 207.

The combination with bias generation integrated in the transceiver 301 and the multiple use of the first transmission stage 203 integrated in the transceiver 301 both as a driver stage for the second transmission stage 205 (or the external 2G power amplifier 205) and to provide the first transmission signal 207 according to the first standard, as shown in FIG. 3, results in a design which is simple to implement for the second transmission stage 205 (for the 2G power amplifier). It is possible for the second transmission stage 205 (the 2G power amplifier for the second transmission signal 211) to consist only of a single-stage transistor network (in the form of the 2G single-stage amplifier 313), an input matching circuit 320, an output matching circuit 321 and a supply circuit 323 or to have only these parts. The matching circuits are purely passive circuits. Alternatively, however, active matching circuits may also be provided which may then be in the form of a switched matching circuit, for example. The purpose of matching is impedance transformation in order to match the impedance at the output of the SP2T 315 to the impedance at the input of the amplifier 313 or to match the impedance at the output of the amplifier 313 to the desired impedance at the output 309 of the second transmission stage 205.

As already stated, the first standard may be a 3G mobile radio standard (or higher, for example 3.5G or 4G), while the second standard is a 2G mobile radio standard.

As already stated, the circuit 101 may also have the RF front-end 317. The RF front-end 317 has a first input 317a for receiving the second transmission signal 211 according to the second standard and a second input 317b for receiving the first transmission signal 207 according to the first standard. The RF front-end 317 also has an output 317c.

The RF front-end 317 comprises various duplexers depending on the bands which are supported by the mobile communication device 100, for example, and an antenna switch (ASM) which switches the various RX/TX signals from the individual bands to the common antenna. The duplexers are passive elements and comprise a filter, for example a combination of a high-pass filter and a low-pass filter which are combined at an antenna connection via a phase shifter. The RF front-end 317 is designed to change over between a reception mode and a transmission mode, for example on the basis of a control signal which is received from the transceiver 301. In the transmission mode, the RF front-end 317 provides either the first transmission signal 207 or the second transmission signal 211 at its output 317c. The output 317c of the RF front-end 317 may form, for example, the antenna connection 103 of the mobile communication device 100 shown in FIG. 1. The RF front-end 317 is therefore designed to switch through either the first transmission signal 207 or the second transmission signal 211 and therefore to pass said signal to an antenna 105 which is connected to the output 317c of the RF front-end 317. Furthermore, signals received via the antenna 105 in the reception mode can be directly passed to the transceiver 301 using the RF front-end 317 and the RX line (reception line).

In summary, the bias signal 209 for the external 2G power amplifier 205 is generated in the transceiver 301 in the circuit 101, thus enabling a CMOS-less design for the 2G power amplifier 205 (the second transmission stage 205). Furthermore, the integrated 3G power amplifier (the first transmission stage 203) is again used as a driver stage for the external second (2G) transmission stage 205.

The circuit 101 therefore provides a transmitter design for use in wireless communication systems. The circuit 101 makes it possible to reduce the implementation costs of a transmission system and also makes it possible to use a smaller printed circuit board (PCB) in comparison with conventional systems.

The first transmission stage 203 may also have a plurality of power amplifier cores, for example an amplifier core for B 1/2 and an amplifier core for B 5/8. Integrating the first transmission stage 203 (the power amplifier for the 3G mode) in the transceiver 301 makes it possible to avoid special 3G power amplifiers which are outside the transceiver 301.

The bias stage 201 of the transceiver 301 may set the bias signal 209, for example, on the basis of a transmission mode (GMSK or 8 PSK), a power control level (for example output power), a frequency and/or a temperature.

In summary, the inventors realized that a more efficient circuit 101, for example for a multi-mode mobile communication device, can be achieved by integrating bias generation for the 2G mode in a transceiver 301 since the transceiver 301 is typically based on the same process as a bias stage 201 for generating the bias signal 209. It was also realized that the area for the second transmission stage 205 (for a power amplifier for the 2G mode) can be reduced if a power amplifier which is already present for the 3G mode (the first transmission stage 203) is used as a pre-amplification stage for the second transmission stage 205, as a result of which the conventional driver stages in a 2G power amplifier can be omitted since this task can now be undertaken by the 3G power amplifier (already present).

Although some aspects have been described in connection with an apparatus, it goes without saying that these aspects are also a description of the corresponding method, with the result that a block or a component of an apparatus can also be understood as a corresponding method step or a feature of a method step. Analogously, aspects which have been described in connection with a method step or as a method step are also a description of a corresponding block or detail or feature of a corresponding apparatus.

Depending on particular implementation requirements, examples can be implemented using hardware or software. Implementation can be carried out using a digital storage medium, for example a floppy disk, a DVD, a Blu-ray disc, a CD, a ROM, a PROM, an EPROM, an EEPROM or a flash memory, a hard disk or another magnetic or optical memory which stores electronically readable control signals which can interact or interact with a programmable computer system in such a manner that the respective method is carried out. The digital storage medium can therefore be computer-readable. Some examples therefore comprise a data storage medium having electronically readable control signals which are able to interact with a programmable computer system in such a manner that one of the methods described herein is carried out.

Generally, examples can be implemented as a computer program product with program code, in which case the program code is effective to the effect that one of the methods is carried out when the computer program product runs on a computer. The program code may also be stored on a machine-readable medium, for example.

Other examples comprise the computer program for carrying out one of the methods described herein, in which case the computer program is stored on a machine-readable medium.

In other words, one implementation of the exemplary method is therefore a computer program having program code for carrying out one of the methods described herein when the computer program runs on a computer. A further implementation of the exemplary method is therefore a data storage medium (or a digital storage medium or a computer-readable medium) on which the computer program for carrying out one of the methods described herein is recorded.

A further implementation of the exemplary method is therefore a data stream or a sequence of signals representing the computer program for carrying out one of the methods described herein. The data stream or the sequence of signals can be configured, for example, to the effect that it can be transferred via a data communication connection, for example via the Internet.

Another example comprises a processing device, for example a computer or a programmable logic component, which is configured or adapted for carrying out one of the methods described herein.

Another example comprises a computer on which the computer program for carrying out one of the methods described herein is installed.

In some examples, a programmable logic component (for example a field-programmable gate array (FPGA)) can be used to carry out some or all of the functionalities of the methods described herein. In some examples, a field-programmable gate array can interact with a microprocessor in order to carry out one of the methods described herein. Generally, in some examples, the methods are carried out by an arbitrary hardware apparatus. This may be universally usable hardware such as a computer processor (CPU) or hardware specific to the method, for example an ASIC.

The examples described above are only an illustration of the principles of the present invention. It goes without saying that modifications and variations of the arrangements and details described herein will be apparent to other specialists. The intention is therefore for the invention to be restricted only by the scope of protection of the patent claims below and not by the specific details which have been presented herein using the description and the explanation of the examples.

The invention claimed is:

1. An apparatus for a mobile communication device, the apparatus comprising:
    a transmitter having a first transmission stage for generating a first transmission signal according to a first mobile communication standard and a bias stage for generating a bias signal for a second mobile communication standard; and
    a second transmission stage for generating a second transmission signal according to the second mobile communication standard, wherein the second transmission stage is effectively coupled to the bias stage in order to receive the bias signal, wherein when output signals in accordance with the second mobile communication standard are to be generated, bias points of the first transmission stage are adapted and an output of the first transmission stage is coupled to an input of the second transmission stage for generation of the second transmission signal as an RF output signal, and wherein when output signals in accordance with the first mobile communication standard are to be generated, the first transmission signal is provided as an RF output signal.

2. The apparatus of claim 1, further comprising:

a first integrated circuit comprising the transmitter including the first transmission stage and the bias stage;

a second integrated circuit comprising the second transmission stage, wherein the first integrated circuit including the first transmission stage and the bias stage comprise using a first fabrication technology and the second integrated circuit including the second transmission stage comprise a second fabrication technology, and wherein the second transmission stage includes a control interface to receive the bias signal and provide an interface between the first and second fabrication technologies.

3. The apparatus of claim 2, wherein the second integrated circuit is separate from the first integrated circuit.

4. The apparatus of claim 3, wherein the first integrated circuit is based on a CMOS fabrication technology and the second integrated circuit is based on a GaAs fabrication technology.

5. The apparatus of claim 1, further comprising:

an RF front end;

controller circuitry to adapt the bias points of the first transmission stage for generating a further signal at a different power level when output signals in accordance with the second mobile communication standard are to be generated; and switching circuitry configured to provide the further signal to an input of the second transmission stage for generation of the second transmission signal as the RF output signal to the RF front end, wherein when output signals in accordance with the first mobile communication standard are to be generated, the switching circuitry is configured to provide the first transmission signal as the RF output signal to the RF front end.

6. The apparatus of claim 5, wherein the first transmission stage is configured to provide the further signal to the input of the second transmission stage for generation of the second transmission signal, a functionality of the first transmission stage corresponds to the functionality of two amplification stages according to the second mobile communication standard which are connected in series, and wherein the second transmission stage comprises an amplification stage, the functionality of which corresponds to the functionality of a third amplification stage according to the second mobile communication standard; and wherein the amplification stage of the second transmission stage is to amplify an output of the first transmission stage in order to obtain the second transmission signal according to the second mobile communication standard.

7. The apparatus of claim 6, wherein the amplification stage of the second transmission stage is a single-stage amplifier.

8. The apparatus of claim 5, wherein the switching circuitry comprises a changeover switch having an input, a first output and a second output;

wherein the input of the changeover switch is connected to an output of the first transmission stage, at which the first transmission stage provides the first transmission signal and the further signal;

wherein the first output of the changeover switch is connected to a data signal input of the second transmission stage, at which the second transmission stage receives the further signal; and wherein the changeover switch is designed to connect its input to its first output in a first mode in which the first transmission stage provides the further signal and to connect its input to its second output in a second mode in which the first transmission stage provides the first transmission signal.

9. The apparatus of claim 5, wherein the controller circuitry is configured to set an output power of the second transmission signal at an output of the second transmission stage by changing a bias for the first transmission stage.

10. The apparatus of claim 9, wherein the controller is part of an integrated circuit or of the integrated circuit comprising the bias stage and the first transmission stage.

11. The apparatus of claim 1, wherein the first mobile communication standard is a 3G or 4G mobile radio standard and the second standard is a 2G mobile radio standard.

12. The apparatus of claim 1, wherein the transmitter is part of an integrated transceiver.

13. A mobile communication device comprising:

RF front end circuitry for coupling with an antenna connection;

a first integrated circuit comprising a transmitter having a first transmission stage for generating a first transmission signal according to a first mobile communication standard and a bias stage for generating a bias signal for a second mobile communication standard; and a second integrated circuit comprising a second transmission stage for generating a second transmission signal according to the second mobile communication standard, wherein the first integrated circuit including the first transmission stage and the bias stage are fabricated using a first fabrication technology and the second integrated circuit including the second transmission stage are fabricated using a second fabrication technology, wherein the second transmission stage includes an control interface to receive the bias signal and provide an interface between the first and second fabrication technologies, wherein when output signals in accordance with the second mobile communication standard are to be generated, bias points of the first transmission stage are adapted and an output of the first transmission stage is coupled to an input of the second transmission stage for generation of the second transmission signal as an RF output signal to the RF front end circuitry, and wherein when output signals in accordance with the first mobile communication standard are to be generated, the first transmission signal is provided as an RF output signal to the RF front end circuitry.

14. A transmitter comprising:

a first integrated circuit comprising a first transmission stage for generating a first transmission signal according to a first mobile communication standard and a bias stage for generating a bias signal for a second mobile communication standard; and a second integrated circuit comprising a second transmission stage for generating a second transmission signal according to the second mobile communication standard, wherein the first integrated circuit including the first transmission stage and the bias stage are fabricated using CMOS fabrication technology and the second integrated circuit including the second transmission stage are fabricated using GaAs fabrication technology, wherein the second transmission stage includes a control interface to receive the bias signal and provide an interface between the fabrication technologies, wherein when output signals in accordance with the second mobile communication standard are to be generated, bias points of the first transmission stage are adapted and an output of the first transmission stage is coupled to an input of the second transmission stage for generation of the second transmission signal as an RF output signal, and wherein when output signals in accordance with the first mobile communication standard are to be generated, the first transmission signal is provided as an RF output signal.

* * * * *